(12) United States Patent
Yokoyama et al.

(10) Patent No.: US 11,417,281 B2
(45) Date of Patent: Aug. 16, 2022

(54) DISPLAY DEVICE

(71) Applicant: SHARP KABUSHIKI KAISHA, Sakai (JP)

(72) Inventors: Makoto Yokoyama, Sakai (JP); Junichi Yamada, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/042,886

(22) PCT Filed: Mar. 30, 2018

(86) PCT No.: PCT/JP2018/013987
§ 371 (c)(1),
(2) Date: Sep. 28, 2020

(87) PCT Pub. No.: WO2019/187156
PCT Pub. Date: Oct. 3, 2019

(65) Prior Publication Data
US 2021/0027718 A1    Jan. 28, 2021

(51) Int. Cl.
*G09G 3/3283*  (2016.01)
*G09G 3/3266*  (2016.01)
*H01L 27/32*   (2006.01)

(52) U.S. Cl.
CPC ......... *G09G 3/3283* (2013.01); *G09G 3/3266* (2013.01); *H01L 27/3276* (2013.01)

(58) Field of Classification Search
CPC . G02F 1/1368; G02F 1/1345; H01L 27/3276; G09F 9/30; G09G 3/3283; G09G 3/3266; G09G 2300/0842; G09G 2300/0861; G09G 2300/042; G09G 2310/0262

USPC ................................................... 345/55, 76
See application file for complete search history.

(56) References Cited

U.S. PATENT DOCUMENTS

| 2006/0138461 | A1 | 6/2006 | Abe et al. |
| 2011/0084946 | A1 | 4/2011 | Park et al. |
| 2012/0112988 | A1 | 5/2012 | Nakanishi et al. |
| 2014/0151682 | A1 | 6/2014 | Saito et al. |
| 2014/0176886 | A1 | 6/2014 | Yoshida |

(Continued)

FOREIGN PATENT DOCUMENTS

| JP | 2005-091962 A | 4/2005 |
| JP | 2006-220832 A | 8/2006 |

(Continued)

OTHER PUBLICATIONS

Machined English Translation for JP 2006220832A, Oct. 18, 2021, pp. 1-13 (Year: 2021).*

*Primary Examiner* — Jimmy H Nguyen
(74) *Attorney, Agent, or Firm* — ScienBiziP, P.C.

(57) ABSTRACT

One of a plurality of data signal lines or one of a plurality of control lines that is electrically coupled to a first lead wiring line, and another one of the plurality of data signal lines or another one of the plurality of control lines that is electrically coupled to a second lead wiring line are adjacent to each other. The first lead wiring line is provided in a first metal layer. The second lead wiring line is provided in a second metal layer being a layer different from the first metal layer. The first lead wiring line and the second lead wiring line are superposed on one another through intermediation of an inorganic insulating film.

4 Claims, 14 Drawing Sheets

(56) References Cited

U.S. PATENT DOCUMENTS

| | | | |
|---|---|---|---|
| 2016/0104430 A1 | 4/2016 | Park | |
| 2016/0300863 A1 | 10/2016 | Koide et al. | |
| 2017/0221434 A1 | 8/2017 | Shima | |
| 2017/0249905 A1* | 8/2017 | Kim | G09G 3/00 |

FOREIGN PATENT DOCUMENTS

| | | |
|---|---|---|
| JP | 2008-003118 A | 1/2008 |
| JP | 2011-085883 A | 4/2011 |
| JP | 2012-103335 A | 5/2012 |
| JP | 2015-222438 A | 12/2015 |
| JP | 2016-081046 A | 5/2016 |
| JP | 2016-200659 A | 12/2016 |
| JP | 2017-134339 A | 8/2017 |
| WO | 2012/008192 A1 | 1/2012 |

\* cited by examiner

DISPLAY DEVICE

TECHNICAL FIELD

The disclosure relates to a display device.

BACKGROUND ART

PTL 1 discloses a technique of suppressing luminance unevenness of a display portion having an irregular shape (a shape including a corner cut out).

CITATION LIST

Patent Literature

PTL 1: JP 2012-103335 A (published May 31, 2012).

SUMMARY

Technical Problem

In the related art described above, there is a problem in a shape of the display portion that is limited to a specific shape.

Solution to Problem

A display device according to an aspect of the disclosure includes a display region having a non-rectangular shape, and a frame region surrounding the display region, wherein the display region includes a plurality of data signal lines configured to transmit a data signal, a plurality of control lines intersecting the plurality of data signal lines, and a plurality of subpixel circuits provided correspondingly to intersections between the plurality of data signal lines and the plurality of control lines, the frame region includes a first lead wiring line being electrically coupled to one of the plurality of data signal lines or one of the plurality of control lines, a second lead wiring line being electrically coupled to a data signal line adjacent to the one of the plurality of data signal lines or a control line adjacent to the one of the plurality of control lines, a drive circuit being electrically coupled to the first lead wiring line, and a drive circuit being electrically coupled to the second lead wiring line, the first lead wiring line is provided in a first metal layer, the second lead wiring line is provided in a second metal layer being different from the first metal layer, and the first lead wiring line and the second lead wiring line are superposed on one another through intermediation of an inorganic insulating film.

Advantageous Effects of Disclosure

According to an aspect of the disclosure, luminance unevenness of a display region having an irregular shape can be improved.

DESCRIPTION OF EMBODIMENTS

Hereinafter, the "same layer" means that a layer is formed in the same process (film formation step), a "lower layer" means that a layer is formed in a previous process to a process in which a layer for comparison is formed, and an "upper layer" means that a layer is formed in a subsequent process to a process in which a layer for comparison is formed.

Figure 1:
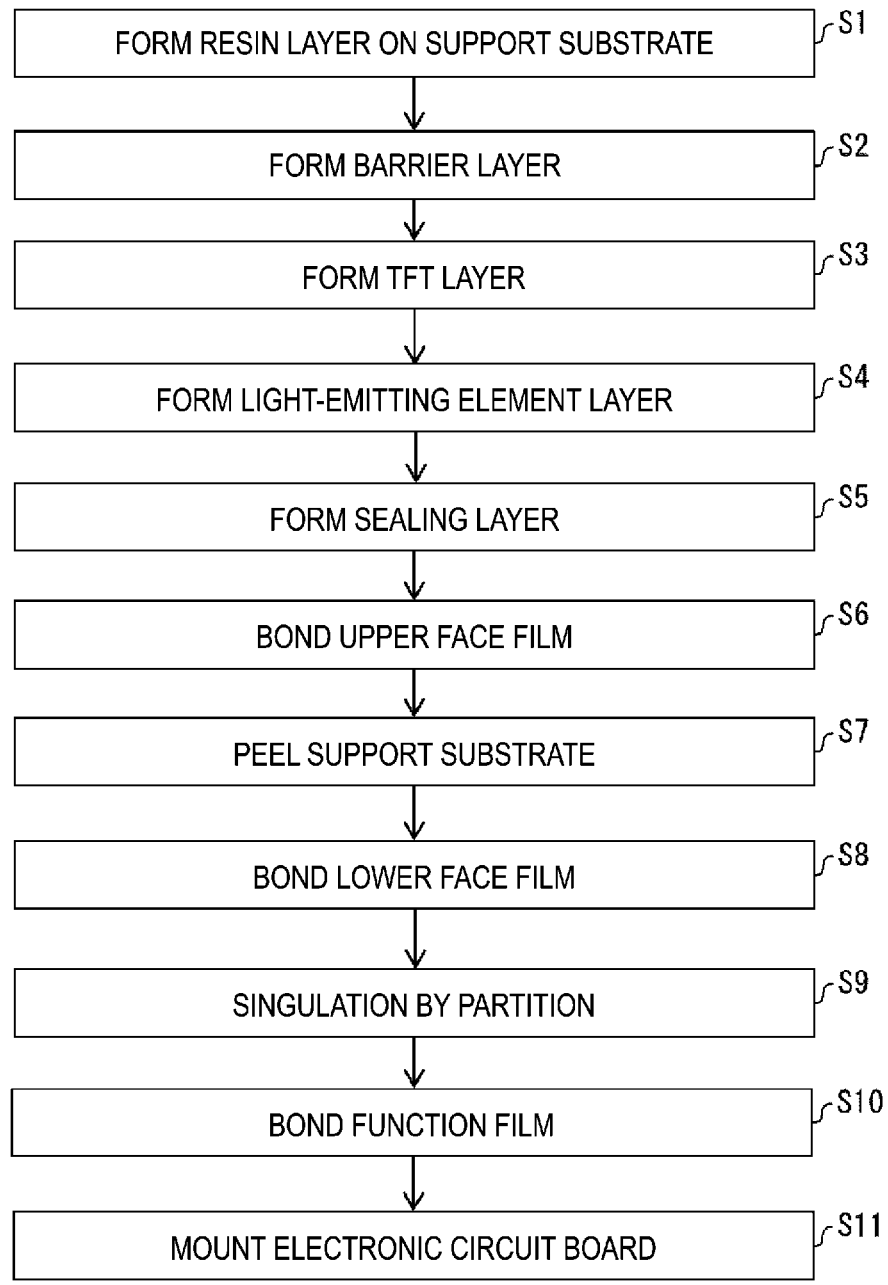
FIG. 1 is a flowchart illustrating an example of a method of manufacturing a display device.

FIG. 1 is a flowchart illustrating an example of a method of manufacturing a display device. FIG. 2(a) is a cross-sectional view illustrating a configuration example of a display portion of a display device. FIG. 2(b) is a flowchart illustrating an example of a step of forming a TFT layer.

Figure 2:
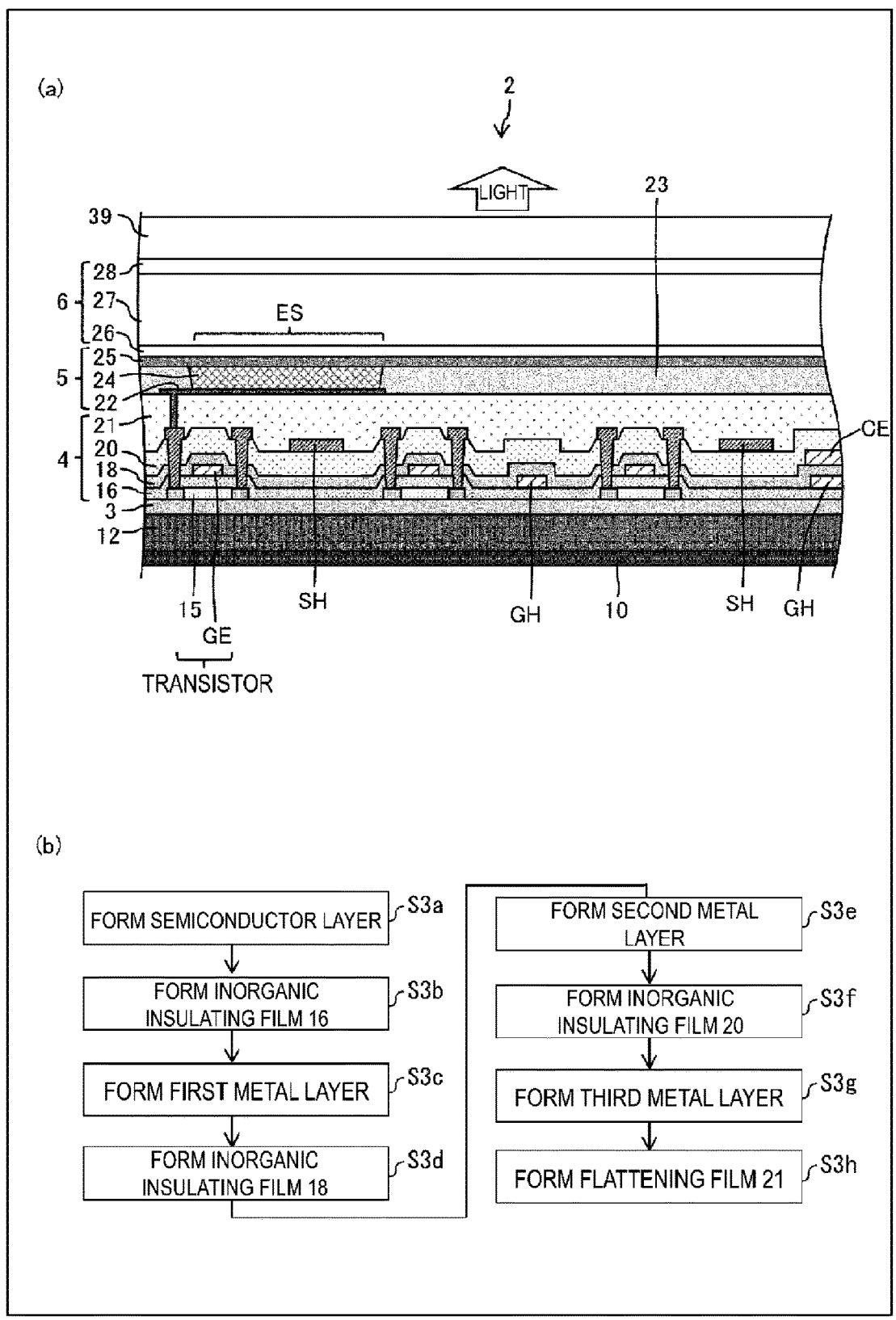
FIG. 2(a) is a cross-sectional view illustrating a configuration example of a display portion of a display device. (b) is a flowchart illustrating an example of a step of forming a TFT

In a case where a flexible display device is manufactured, as illustrated in FIG. 1 and FIG. 2, first, a resin layer 12 is formed on a light-transmitting support substrate (mother glass, for example) (step S1). Then, a barrier layer 3 is formed (step S2). Then, a TFT layer 4 is formed (step S3). Then, a light-emitting element layer 5 of a top-emitting type is formed (step S4). Then, a sealing layer 6 is formed (step S5). Then, an upper face film is bonded on the sealing layer 6 (step S6).

Then, the support substrate is peeled from the resin layer 12 by irradiation of laser light or the like (step S7). Then, a lower face film 10 is bonded to a tower face of the resin layer 12 (step S8). Then, a layered body including the lower face film 10, the resin layer 12, the barrier layer 3, the TFT layer 4, the light-emitting element layer 5, and the sealing layer 6 is partitioned and a plurality of individual pieces are obtained (step S9). Then, a function film 39 is bonded to the obtained individual pieces (step S10). Then, an electronic circuit board (for example, an IC chip and an FPC) is mounted on a portion (terminal section) in an outer side (a non-display region, a frame edge) of a display region in which a plurality of subpixels are formed (step S11). Note that steps S1 to S11 are performed by a display device manufacturing apparatus (including a film formation apparatus performing each step of steps S1 to S5).

Examples of a material of the resin layer 12 include a polyimide. The portion corresponding to the resin layer 12 can be replaced with two resin films (for example, polyimide films) and an inorganic insulating film sandwiched between the resin films.

The barrier layer 3 is a layer that prevents foreign matters such as moisture and oxygen from entering the TIFF layer 4 and the light-emitting element layer 5, and can include a silicon oxide film, a silicon nitride film, or a silicon oxynitride film, or a layered film of these, formed by CVD.

The TFT layer 4 includes a semiconductor film 15, an inorganic insulating film 16 (gate insulating film) that is an upper layer overlying the semiconductor film 15, a gate electrode GE and a gate wiring line GH that are upper layers overlying the inorganic insulating film 16, an inorganic insulating film 18 that is an upper layer overlying the gate electrode GE and the gate wiring line GH, a capacitance electrode CE that is an upper layer overlying the inorganic insulating film 18, an inorganic insulating film 20 that is an upper layer overlying the capacitance electrode CE, a source wiring line SH that is an upper layer overlying the inorganic insulating film 20, and a flattening film 21 (interlayer insulating film) that is an upper layer overlying the source wiring line SH.

The semiconductor film 15 includes, for example, a low-temperature polysilicon (LTPS) or an oxide semiconductor (for example, an In—Ga—Zn—O based semiconductor), and a transistor (TFT) is constituted to include the semiconductor film 15 and the gate electrode GE. The transistor including a top gate structure is illustrated in FIG. 2. However, the transistor may include a bottom gate structure.

The gate electrode GE, the gate wiring line GH, the capacitance electrode CE, and the source wiring line SH each include, for example, a single layer film or a layered film of a metal including at least one of aluminum, tungsten, molybdenum, tantalum, chromium, titanium, and copper. As illustrated in FIG. 2(b), the TFT layer 4 includes a single semiconductor layer and three metal layers (a first metal layer, a second metal layer, and a third metal layer).

Each of the inorganic insulating films 16, 18, and 20 can include, for example, a silicon oxide (SiOx) film or a silicon nitride (SiNx) film, or a layered film of these, formed by CVD. The flattening film 21 can include, for example, a coatable organic material such as polyimide or acrylic.

The light-emitting element layer 5 includes an anode 22 that is an upper layer overlying the flattening film 21, an edge cover 23 having insulating properties and covering an edge of the anode 22, an electroluminescence (EL) layer 24 that is an upper layer overlying the edge cover 23, and a cathode 25 that is an upper layer overlying the EL layer 24. The edge cover 23 is formed by applying an organic material such as polyimide and acrylic and then by patterning the organic material by photolithography, for example.

A light-emitting element ES (for example, an organic light emitting diode (OLED), a quantum dot light emitting diode (QLED)) including the anode 22, the EL layer 24, and the cathode 25 in island shapes is formed for each subpixel in the light-emitting element layer 5. A control circuit of the light-emitting element ES is formed in the TFT layer 4, and the light-emitting element and the control circuit constitute a subpixel circuit.

For example, the EL layer 24 is constituted by layering a hole injection layer, a hole transport layer, a light-emitting layer, an electron transport layer, and an electron injection layer in this order, from the lower layer side. The light-emitting layer is formed in an island shape in an opening (for each subpixel) of the edge cover 23 by vapor deposition or an ink-jet method. Other layers are formed in an island shape or a solid-like shape (common layer). In addition, a configuration in which one or more of the hole injection layer, the hole transport layer, the electron transport layer, and the electron injection layer are not formed is also possible.

In a case where a light-emitting layer of an OLED is formed by vapor deposition, a fine metal mask (FMM) is used. The FMM is a sheet having a number of openings (formed of, for example, an invar material), and an organic material passing through one opening forms a light-emitting layer having an island shape (corresponding to one subpixel).

Regarding a light-emitting layer of a QLED, for example, a light-emitting layer having an island shape (corresponding to one subpixel) can be formed by applying a solvent in which a quantum dot is dispersed, by an ink-jet method.

The anode (anode electrode) 22 includes, for example, layering of indium Tin Oxide (ITO) and silver (Ag) or an alloy including Ag, and has light reflectivity. The cathode (cathode electrode) 25 can include a light-transmitting conductive material such as an MgAg alloy (extremely thin film), ITO, or Indium Zinc Oxide (IZO).

In a case where the light-emitting element ES is an OLED, a positive hole and an electron are recombined inside the light-emitting layer in response to a drive current between the anode 22 and the cathode 25, and light is emitted in a process where an exciton generated by the recombination transits to a ground state. Since the cathode 25 is light-transmitting and the anode 22 has light reflectivity, light emitted from the EL layer 24 travels upward and top-emitting is achieved.

In a case where the light-emitting element ES is a QLED, a positive hole and an electron are recombined inside the light-emitting layer in response to a drive current between the anode 22 and the cathode 25, and light (fluorescence is emitted in a process where an exciton generated by the recombination transits from a conduction band level to a valence band level of a quantum dot.

A light-emitting element (inorganic light-emitting diode or the like) other than the OLED and the QLED described above may be formed in the light-emitting element layer 5.

The sealing layer 6 is light-transmitting, and includes an inorganic sealing film 26 covering the cathode 25, an organic buffer film 27 that is an upper layer overlying the inorganic sealing film 26, and an inorganic sealing film 28 that is an upper layer overlying the organic buffer film 27. The sealing layer 6 covering the light-emitting element layer 5 prevents foreign matters such as water and oxygen from penetrating the light-emitting element layer 5.

Each of the inorganic sealing film 26 and the inorganic sealing film 28 is an inorganic insulating film, and can include, for example, a silicon oxide film, a silicon nitride film, or a silicon oxynitride film, or a layered film of these, formed by CVD. The organic buffer film 27 is a light-transmitting organic film having a flattening effect, and can include a coatable organic material such as acrylic. The organic buffer film 27 can be formed by, for example, ink-jet application, and a hank for stopping a liquid droplet may be provided in a non-display region.

The lower face film 10 is, for example, a PET film bonded in a lower face of the resin layer 12 after the support substrate is peeled, to realize a display device having excellent flexibility. The function film 39 has at least one of an optical compensation function, a touch sensor function, and a protection function, for example.

The flexible display device is described above. In a case of manufacturing a non-flexible display device, since formation of a resin layer, replacement of a substrate, and the like are not required in general, the layering step of steps S2 to S5 is performed on a glass substrate, and subsequently the process proceeds to step S9, for example.

First Embodiment

Figure 3:
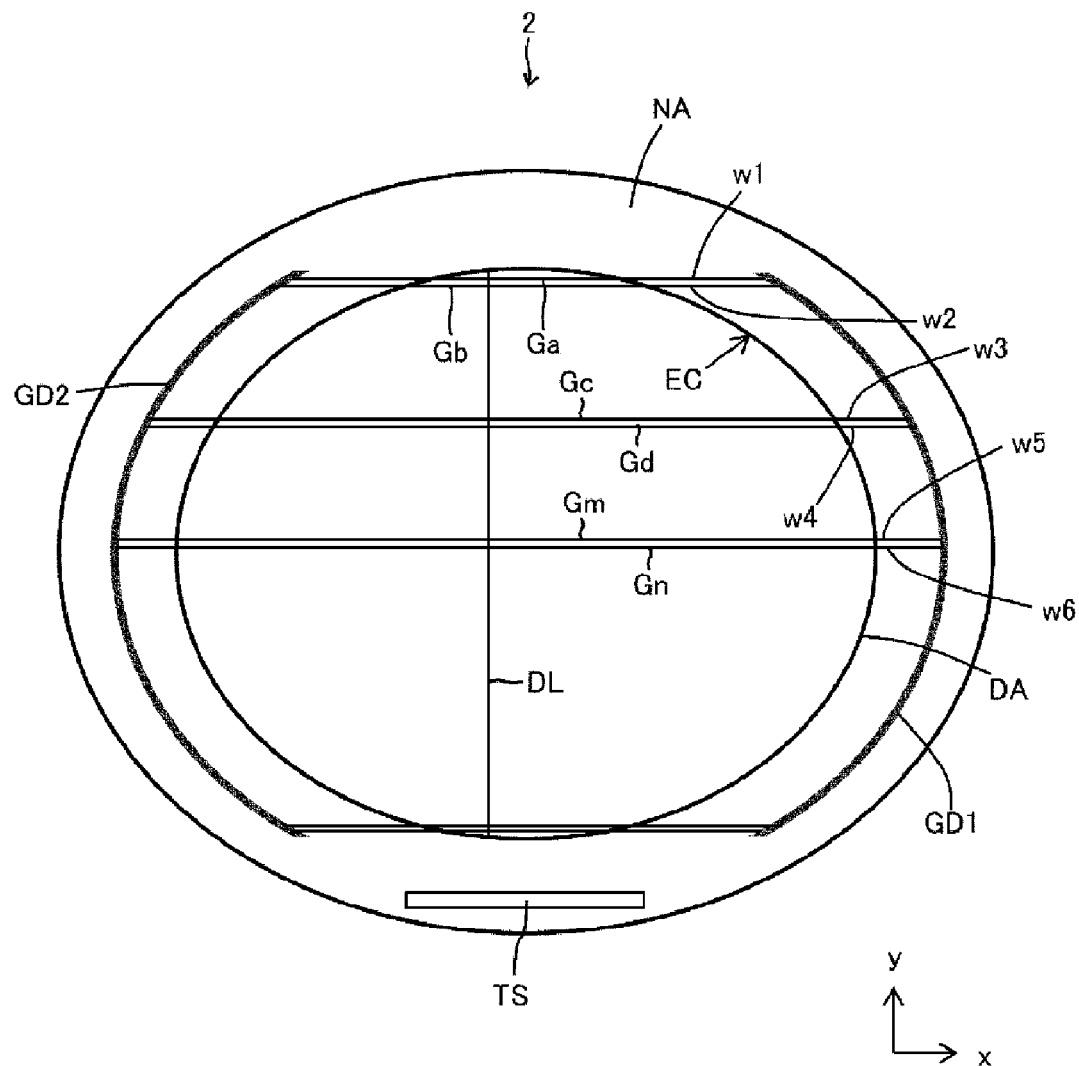
FIG. 3 is a plan view illustrating a configuration of a display device of a first embodiment.
Figure 4:
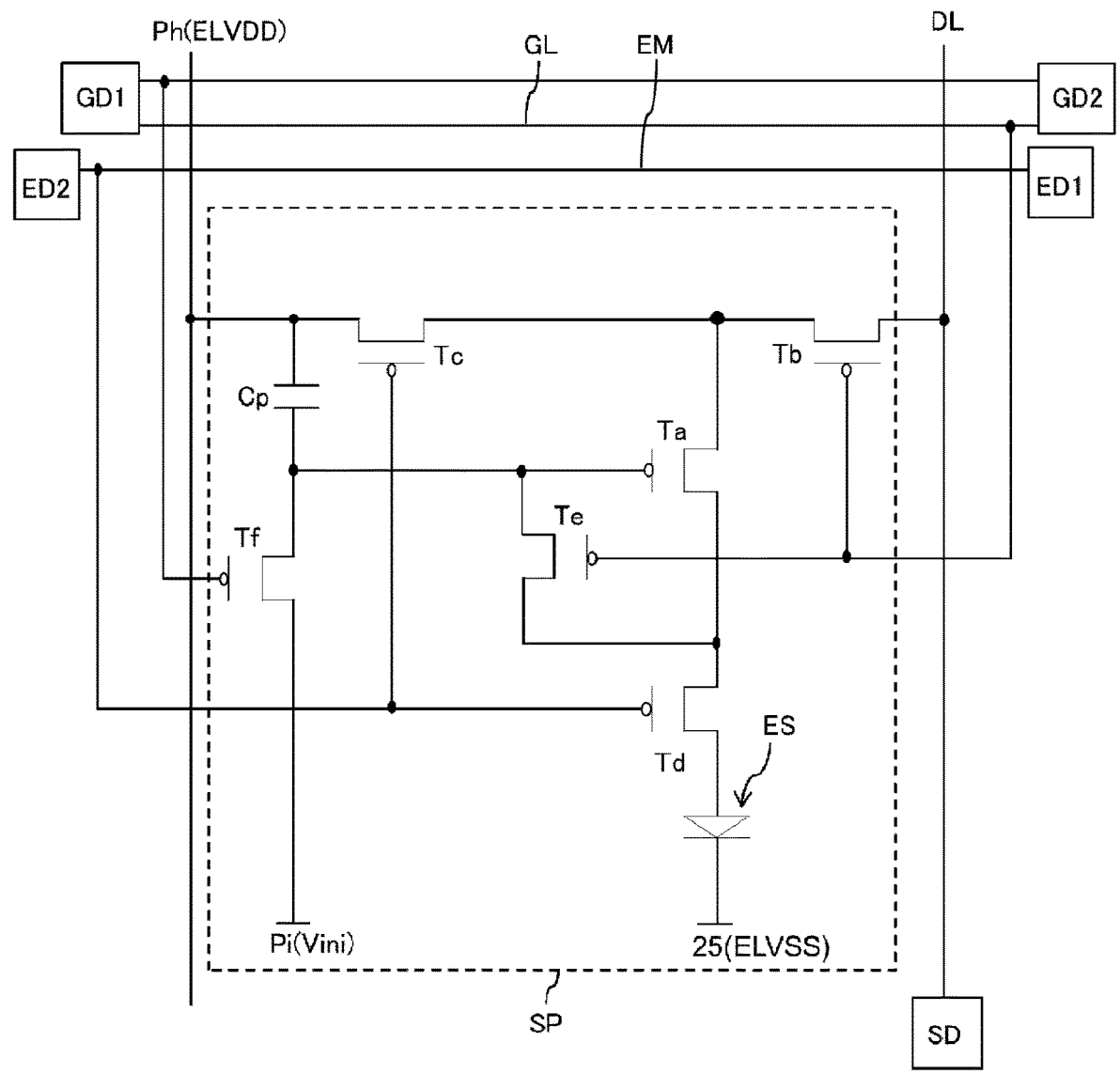
FIG. 4 is a circuit diagram illustrating a configuration example of a subpixel circuit provided in a display region.

FIG. 3 is a plan view illustrating a configuration of a display device of a first embodiment. FIG. 4 is a circuit diagram illustrating a configuration example of a subpixel circuit provided in a display region. As illustrated in FIG. 3, a display device 2 includes a display region DA including a subpixel and a frame region (non-display region) NA surrounding the display region DA. The display region DA is of an elliptical type having a major axis in an x direction, and in a subpixel circuit SP including the light-emitting element ES, an entire edge of the display region DA is a curved line edge EC. The subpixel circuit SP is coupled to a data signal line DL, a scanning signal line GL, a light emission control line EM, a high voltage power source line Ph, and an initialization power source line Pi. Note that one of electrodes of a capacitance Cp is coupled to the high voltage power source line Ph, and the other electrode is coupled to a gate terminal of a drive transistor Ta. The drive transistor Ta includes a gate terminal coupled to a scanning signal line Gx, a source terminal coupled to the data signal line DL via a write transistor Tb, and a drain terminal coupled to the light-emitting element ES via a transistor Td. The data signal line DL is coupled to a source driver SD, the scanning signal tine GL is coupled to gate drivers (drive circuits) GD1 and GD2, and the light emission control line EM is coupled to light emission drivers (drive circuits) ED1 and ED2. The gate drivers GD1 and GD2 and the light emission drivers ED1 and ED2 are formed monolithically in the TFT layer 4 provided in the frame region NA. The gate drivers GD1 and GD2 each have an arcuate shape along the curved line edge EC, and are arrayed to sandwich the display region DA in the major axis direction. The same applies to the light emission drivers ED1 and ED2.

In the display region DA of the display device 2, scanning signal lines Ga to Gd, Gm, and Gn extending in the x direction and the data signal line DL extending in a y direction and intersecting each of the scanning signal lines are provided. The scanning signal lines Ga and Gb are adjacent to each other, the scanning signal lines Gc and Gd are adjacent to each other, and the scanning signal lines Gm and Gn are adjacent to each other. The Gc is positioned on the center side of the display region with respect to the scanning signal line Ga, and a relationship of the length of the scanning signal line Gc>the length of the scanning signal line Ga is satisfied. The Gm is positioned at the center of the display region, and a relationship of the scanning signal line Gm>the length of the scanning signal line Gc is satisfied.

The scanning signal lines Ga to Gd, Gm, and Gn are coupled to the gate drivers GD1 and GD2. Note that in the frame region NA a terminal section TS for mounting an external substrate is disposed in one end portion with respect to a minor axis direction (y direction).

In the following description, a first lead wiring line w1 to a sixth lead wiring line w6 are abbreviated to lead wiring lines w1 to w6, respectively.

Figure 5:
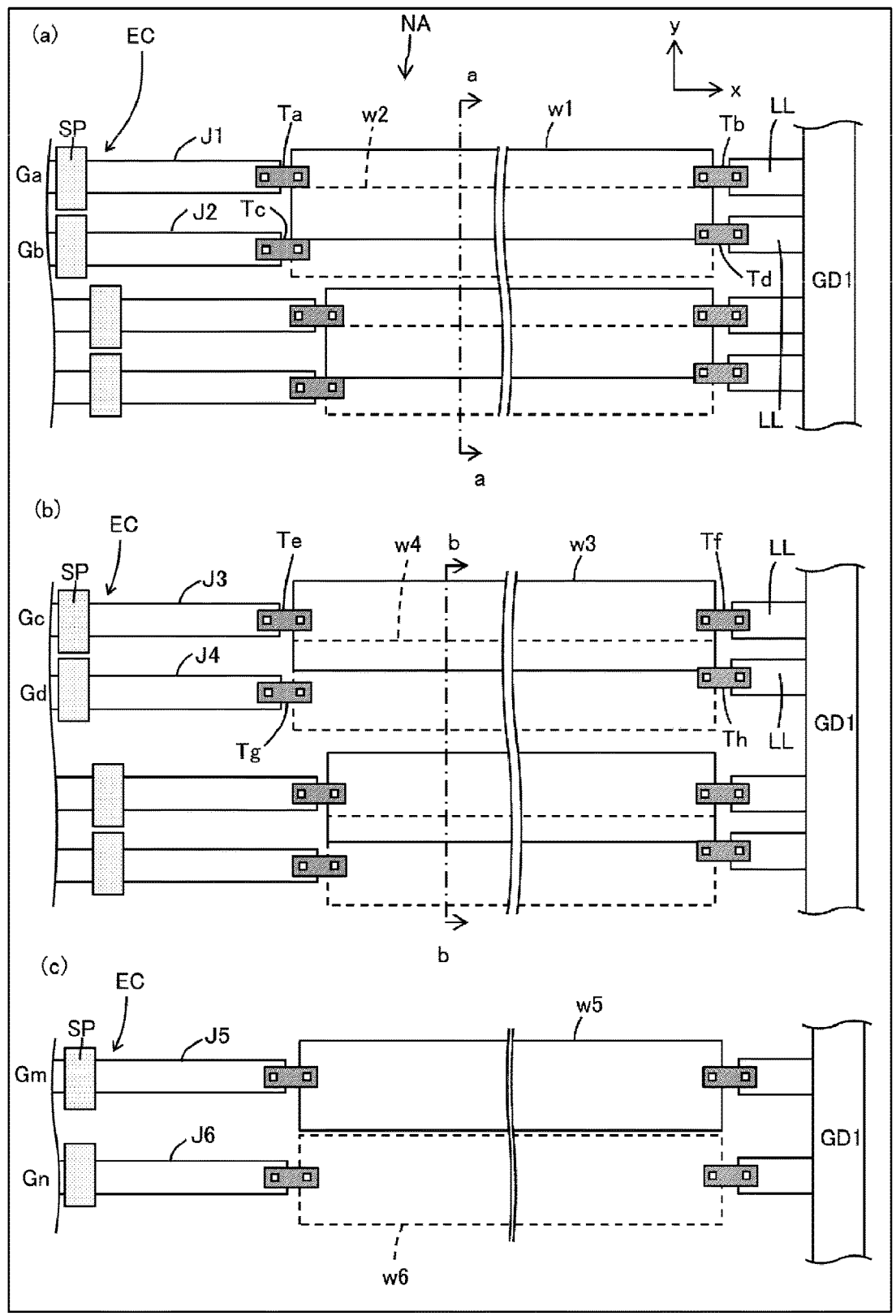
FIG. 5 is a plan view illustrating a configuration of a periphery of an edge of a display region.

FIG. 5 is a plan view illustrating a configuration of a periphery of an edge of the display region. FIG. 6(a) is a cross-sectional view taken along a-a of FIG. 5. FIG. 6(b) is a cross-sectional view taken along b-b of FIG. 5. As illustrated in FIG. 2, regarding the TFT layer 4, the semiconductor layer (including the semiconductor film 15 of FIG. 2) is formed at step S3a, the first metal layer (including the gate electrode GE and the gate wiring line GH of FIG. 2) is formed at step S3c, the second metal layer (including the capacitance electrode CE of FIG. 2) is formed at step S3e, and a third metal layer (including the source wiring line SH of FIG. 2) is formed at step S3g.

Figure 6:
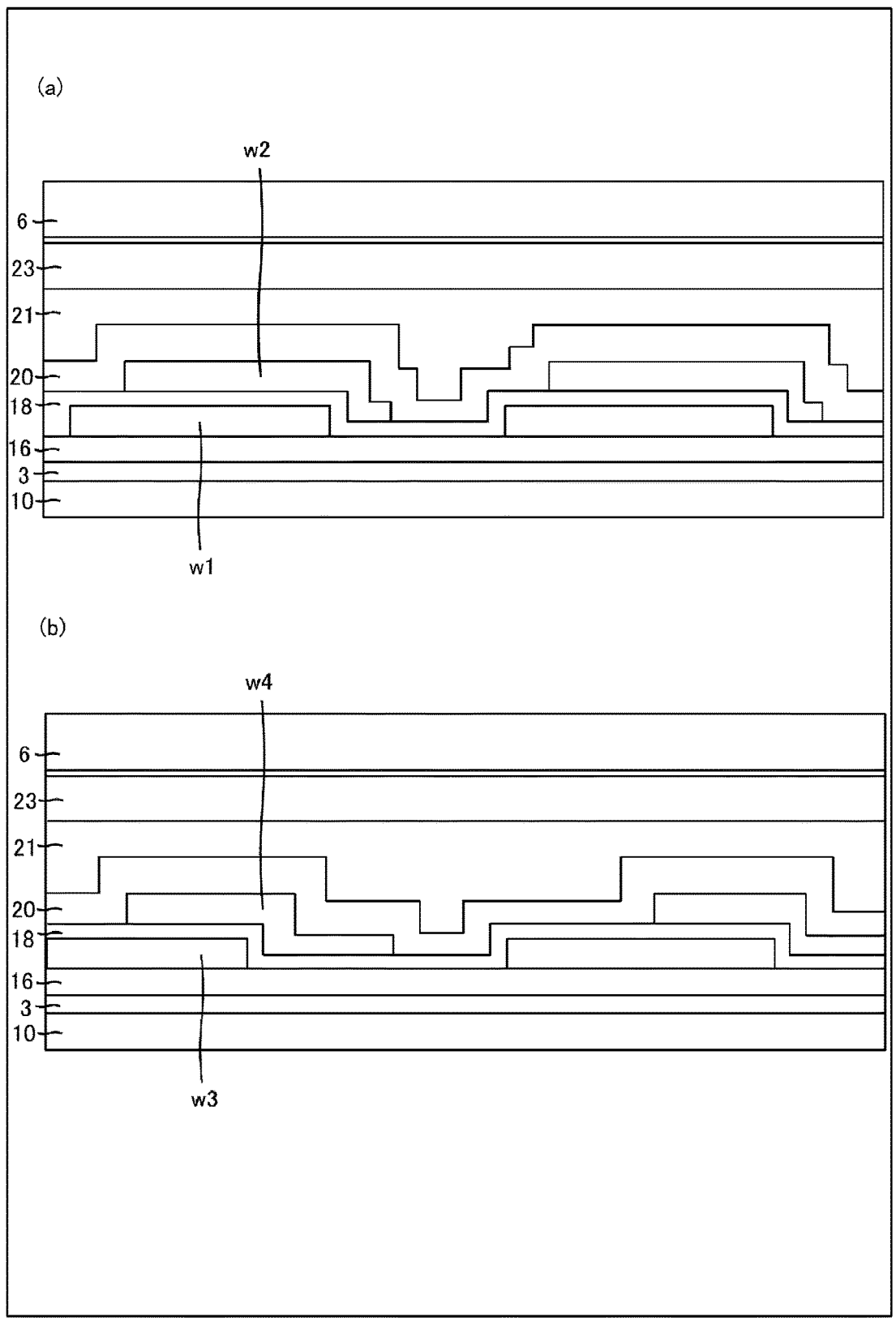
FIG. 6(a) is a cross-sectional view taken along a-a of FIG. 5, and (b) is a cross-sectional view taken along b-b of FIG. 5.

As illustrated in FIG. 5(a) and FIG. 6, the TFT layer 4 of the display device 2 includes the lead wiring line w1 (the first lead wiring line) provided in the first metal layer and the lead wiring line w2 (the second lead wiring line) provided in the second metal layer. The lead wiring line w1 is electrically coupled to an extension wiring line J1 (provided in the first metal layer) extending outward from the curved tine edge EC, via a relay electrode Ta (provided in the third metal layer), and is coupled to the gate driver GD1 via a relay electrode Tb (provided in the third metal layer) and a relay wiring line LL (provided in the first metal layer). The lead wiring line w2 is electrically coupled to an extension wiring line J2 (provided in the first metal layer) extending outward from the curved tine edge EC, via a relay electrode Tc (provided in the third metal layer), and is coupled to the gate driver GD1 via a relay electrode Td (provided in the third metal layer and the relay wiring line LL (provided in the first metal layer).

The extension wiring line J1 is coupled to the scanning signal line Ga (provided in the first metal layer) in the display region DA, and the extension wiring line J2 is coupled to the scanning signal line Gb (provided in the first metal layer) in the display region DA. The lead wiring lines w1 and w2 are linear, and are superposed on one another through intermediation of the inorganic insulating film 18 while extending in the x direction. The superposed portion has an elongated shape. Accordingly, capacitance between the lead wiring line w1 and the lead wiring line w2 can be applied to the lead wiring line w1, and capacitance between the lead wiring line w1 and the lead wiring line w2 can be applied to the lead wiring line w2.

As illustrated in FIG. 5(b) and FIG. 6, the TFT layer 4 of the display device 2 includes the lead wiring line w3 provided in the first metal layer and the lead wiring line w4 provided in the second metal layer. The lead wiring line w3 is electrically coupled to an extension wiring tine J3 (provided in the first metal layer) extending outward from the curved line edge EC, via a relay electrode Te (provided in the third metal layer), and is coupled to the gate driver GD1 via a relay electrode Tf (provided in the third metal layer) and the relay wiring line LL (provided in the first metal layer). The lead wiring line w4 is electrically coupled to an extension wiring line J4 (provided in the first metal layer) extending outward from the curved line edge EC, via a relay electrode Tg (provided in the third metal layer), and is coupled to the gate driver GD1 via a relay electrode Th (provided in the third metal layer) and the relay wiring line LL (provided in the first metal layer).

The extension wiring line J3 is coupled to the scanning signal line Gc (provided in the first metal layer) of the display region DA, and the extension wiring line J4 is coupled to the scanning signal line Gd (provided in the first metal layer) of the display region DA. The lead wiring lines w3 and w4 are linear, and are superposed on one another through intermediation of the inorganic insulating film 18 while extending in the x direction. The superposed region has an elongated shape. Accordingly, capacitance between the lead wiring line w3 and the lead wiring line w4 can be applied to the lead wiring line w3, and capacitance between the lead wiring line w3 and the lead wiring line w4 can be applied to the lead wiring line w4.

As illustrated in FIG. 5 and FIG. 6, the overlapping area of the lead wiring line w3 and the lead wiring line w4 is smaller than the overlapping area of the lead wiring line w1 and the lead wiring line w2. Thus, the capacitance applied to the lead wiring line w1 that is electrically coupled to the scanning signal line Ga is larger than the capacitance applied to the lead wiring line w3 that is electrically coupled to the scanning signal line Gc.

Figure 7:
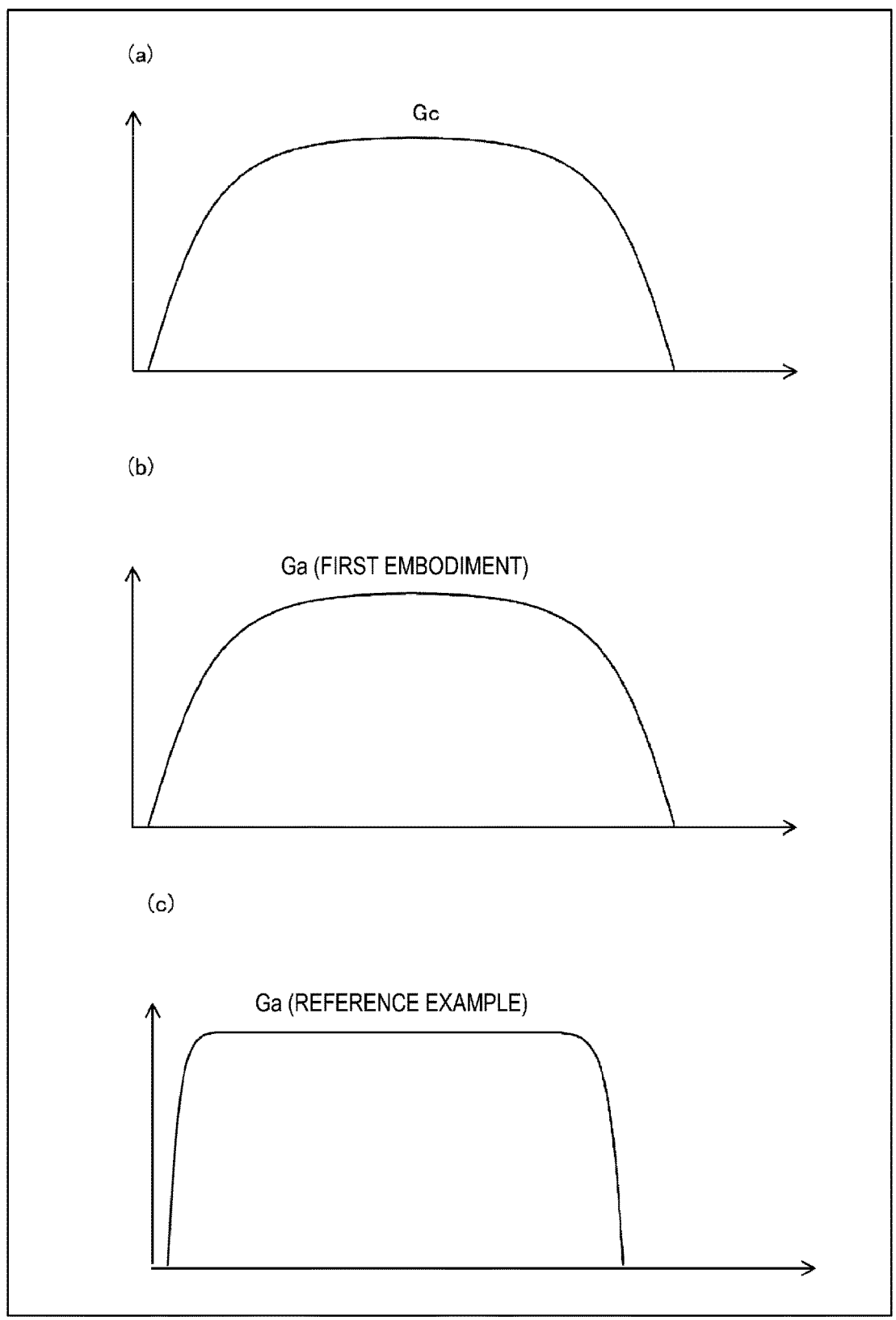
FIGS. 7(a) and (b) are schematic views illustrating scanning pulse waveforms in the first embodiment, and (c) is a schematic view illustrating a scanning pulse waveform in a reference example.

FIGS. 7(a) and (b) are schematic views illustrating scanning pulse waveforms in the first embodiment. FIG. 7(c) is a schematic view illustrating a scanning pulse waveform in a reference example. The number of subpixel circuits coupled to the scanning signal line Ga is smaller than the number of the subpixel circuits coupled to the scanning signal line Gc (the length of the scanning signal line Gc>the length of the scanning signal line Ga). Thus, for the gate drivers GD1 and GD2, a drive load of the scanning signal line Ga that is electrically coupled to the gate drivers GD1 and GD2 is smaller than a drive load of the scanning signal line Gc. Then, larger capacitance is applied to the lead wiring line w1 than the lead wiring line w3, and thus a difference between the drive load of the scanning signal line Gc and the drive load of the scanning signal line Ga can be reduced.

Accordingly, a rising waveform and a falling waveform of a scanning pulse in the scanning signal line Gc (see FIG. 7(a)) and a rising waveform and a falling waveform of a scanning pulse in the scanning signal tine Ga (see FIG. 7(b)) match each other, respectively. Thus, luminance unevenness in the minor axis (y direction) is less likely to be caused in the display region DA.

Note that, in a case where capacitance is not applied to the lead wiring lines w1 and w3 (the lead wiring lines w1 and w2 do not overlap each other, and the lead wiring lines w3 and w4 do not overlap each other), a rising waveform and a falling waveform of a signal pulse in the scanning signal line Ga (see FIG. 7(c)) are steeper than the rising waveform and the falling waveform of the signal pulse in the scanning signal line Gc (see FIG. 7(a)). Thus, luminance unevenness may be caused.

In FIG. 5, the overlapping width of the lead wiring line w3 and the lead wiring line w4 is smaller than the overlapping width of the lead wiring line w1 and the lead wiring line w2. However, the overlapping length of the lead wiring line w3 and the lead wiring line w4 may be smaller than the overlapping length of the lead wiring line w1 and the lead wiring line w2.

Note that, as illustrated in FIG. 6(b), regarding the scanning signal lines Gm and Gn that pass in the vicinity of the major axis of the display region DA having an elliptical shape and that have a substantially maximized drive load, the lead wiring line w5 (provided in the first metal layer) electrically coupled to the scanning signal line Gm and the lead wiring line w6 (provided in the second metal layer) electrically coupled to the scanning signal line Gn do not overlap each other (no capacitance is applied to the lead wiring lines w5 and w6).

In FIG. 5 and FIG. 6, the superposition structure of the lead wiring lines in the vicinity of the gate driver GD1 is described. The same superposition structure applies to the lead wiring lines in the vicinity of the gate driver GD2.

Figure 8:
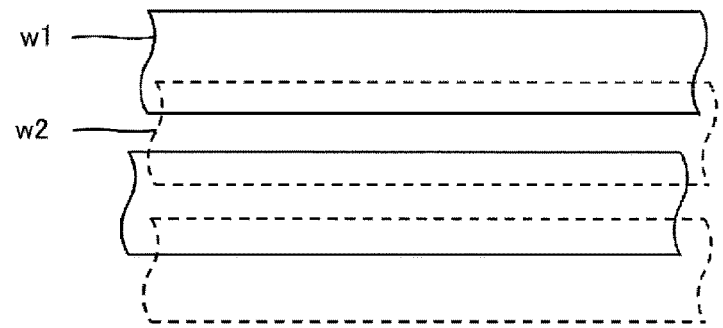
FIG. 8 is a plan view illustrating a superposition configuration of lead wiring lines.
Figure 8:
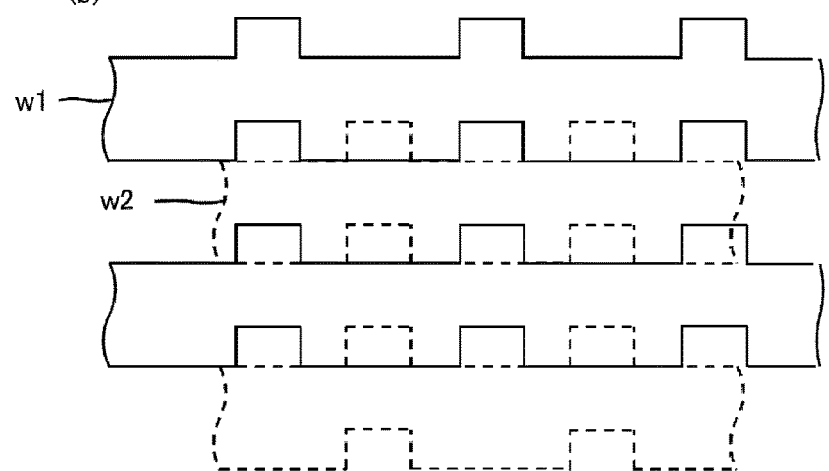

In FIG. 5, the lead wiring line w2 only overlaps the lead wiring line w1, but the structure is not limited to this. For example, as illustrated in FIG. 8, a configuration in which the lead wiring line w2 overlaps adjacent two lead wiring lines can be adopted. In this case, the lead wiring lines w1 and w2 may be linear as illustrated in FIG. 8(a), or may have a shape having a recess and a protrusion in a plane direction as illustrated in FIG. 8(b). In this case, the protrusion of the lead wiring line w2 overlaps the lead wiring line w1 or the like.

Figure 9:
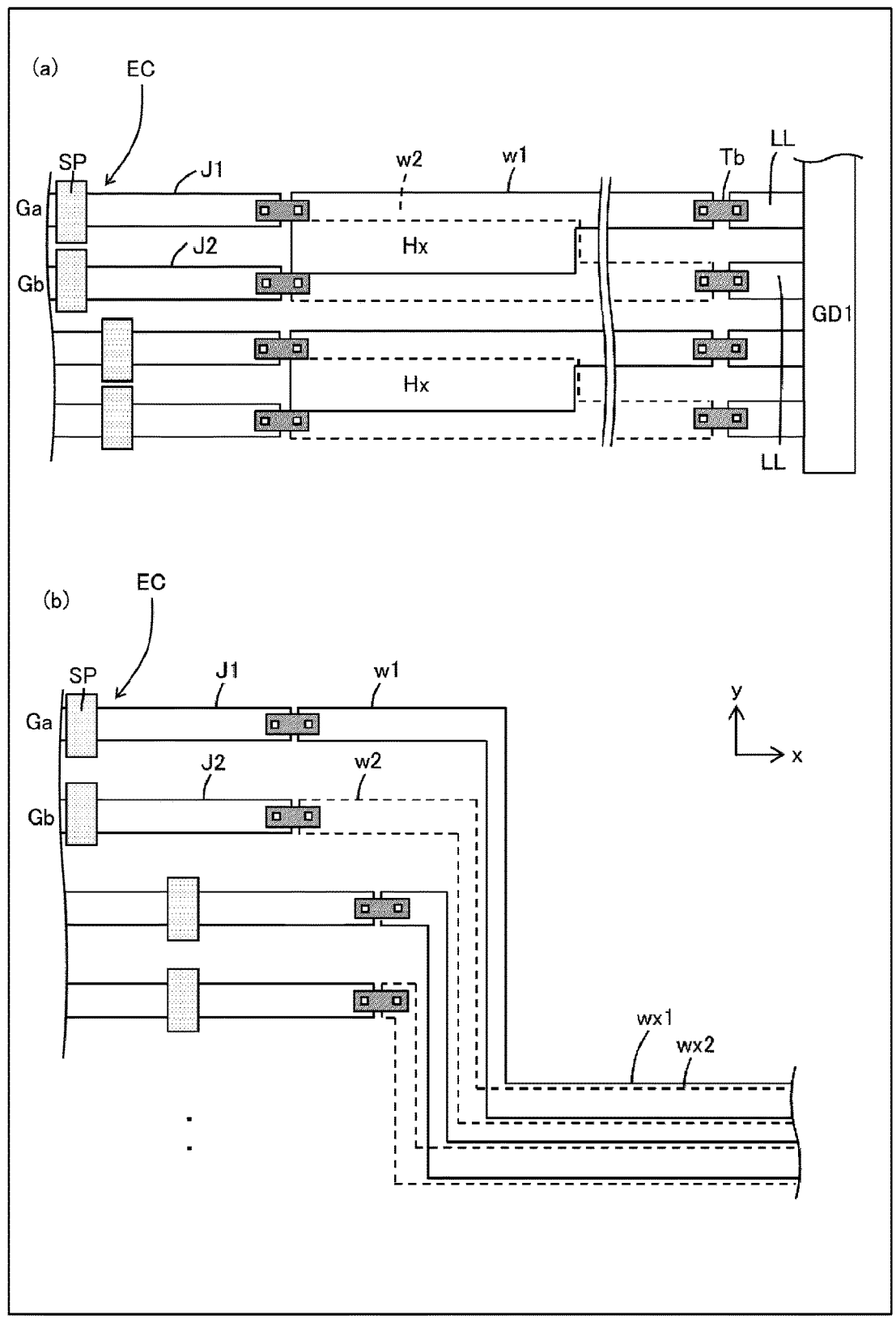
FIG. 9 is a plan view illustrating another configuration example of a periphery of a display region.

In the first embodiment, as illustrated in FIG. 9(a), a configuration in which each of the lead wiring line w1 and the lead wiring line w2 has a wide portion Hx that is locally wide, and the wide portion Hx of the lead wiring tine w1 and the wide portion Hx of the lead wiring line w2 are superposed on one another may be adopted.

In addition, as illustrated in FIG. 9(b), a configuration in which the lead wiring lines w1 and w2 each have a bent shape and an x-direction extension portion wx1 of the lead wiring line w1 and an x-direction extension portion wx2 of the lead wiring line w2 are superposed on one another through intermediation of the inorganic insulating film 18 may be adopted. In this manner, capacitance between the lead wiring line w1 and the lead wiring line w2 can be applied to the lead wiring line w1, and capacitance between the lead wiring line w1 and the lead wiring line w2 can be applied to the lead wiring line w2.

Figure 10:
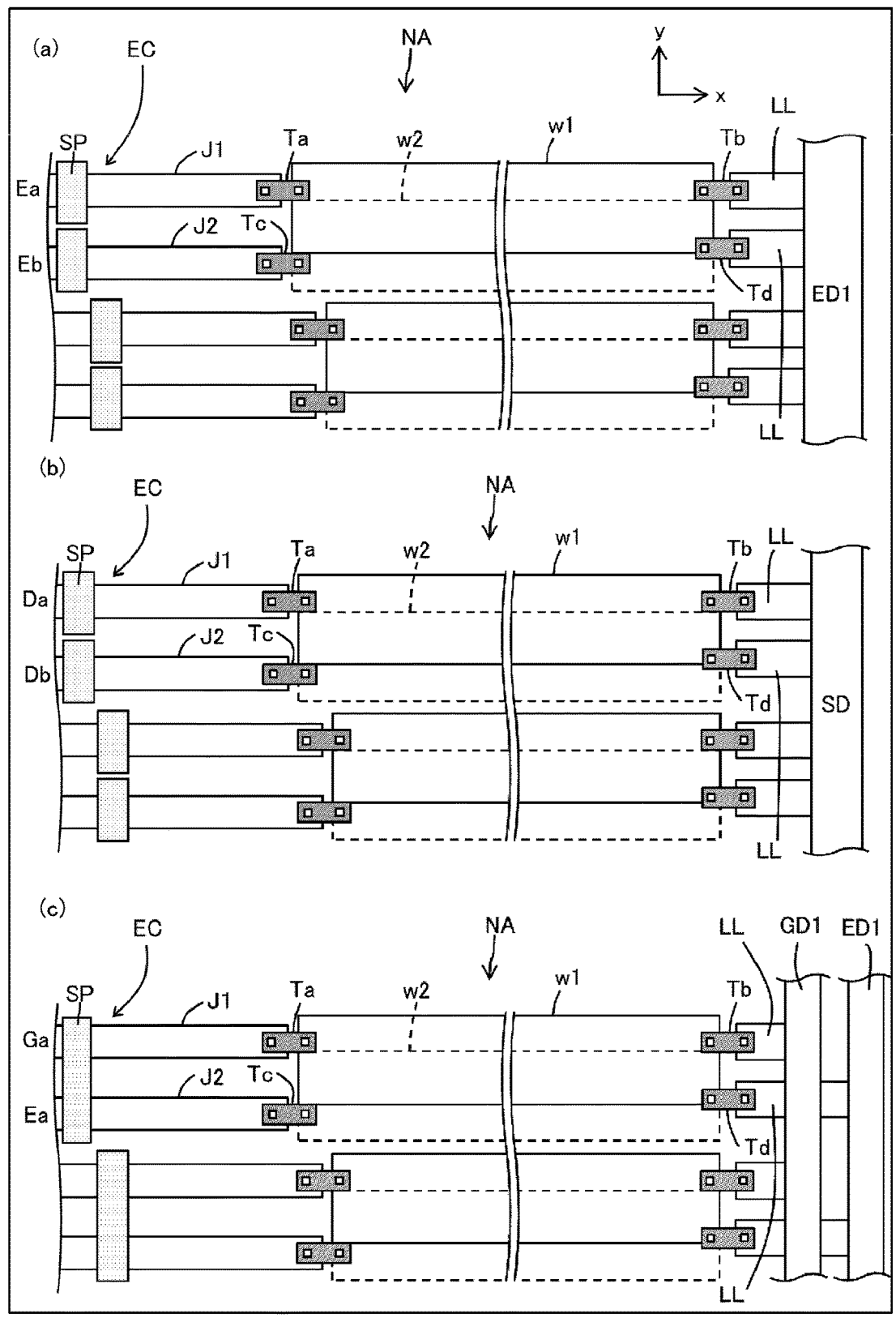
FIG. 10 is a plan view illustrating another configuration example of a periphery of a display region.

In addition, as illustrated in FIG. 10(a), the lead wiring line w1 (provided in the first metal layer) and the lead wiring line w2 (provided in the second metal layer) may be electrically coupled to light emission control lines Ea and Eb (provided in the first metal layer) and the light emission driver ED1 (for example, formed monolithically in the frame region NA).

In addition, as illustrated in FIG. 10(b), the lead wiring line w1 (provided in the first metal layer) and the lead wiring line w2 (provided in the second metal layer) may be electrically coupled to data signal lines Da and Db (provided in the third metal layer) and the source driver SD (for example, a time division drive circuit SSD formed monolithically in the frame region NA).

In addition, as illustrated in FIG. 10(c), the lead wiring line w1 may be electrically coupled to the scanning signal line Ga and the gate driver GD1, and the lead wiring line w2 may be electrically coupled to the light emission control line Ea and the light emission driver ED1.

In the first embodiment, the display region DA has an elliptical shape. However, the shape is not limited to this, and may be a circular shape.

Second Embodiment

Figure 11:
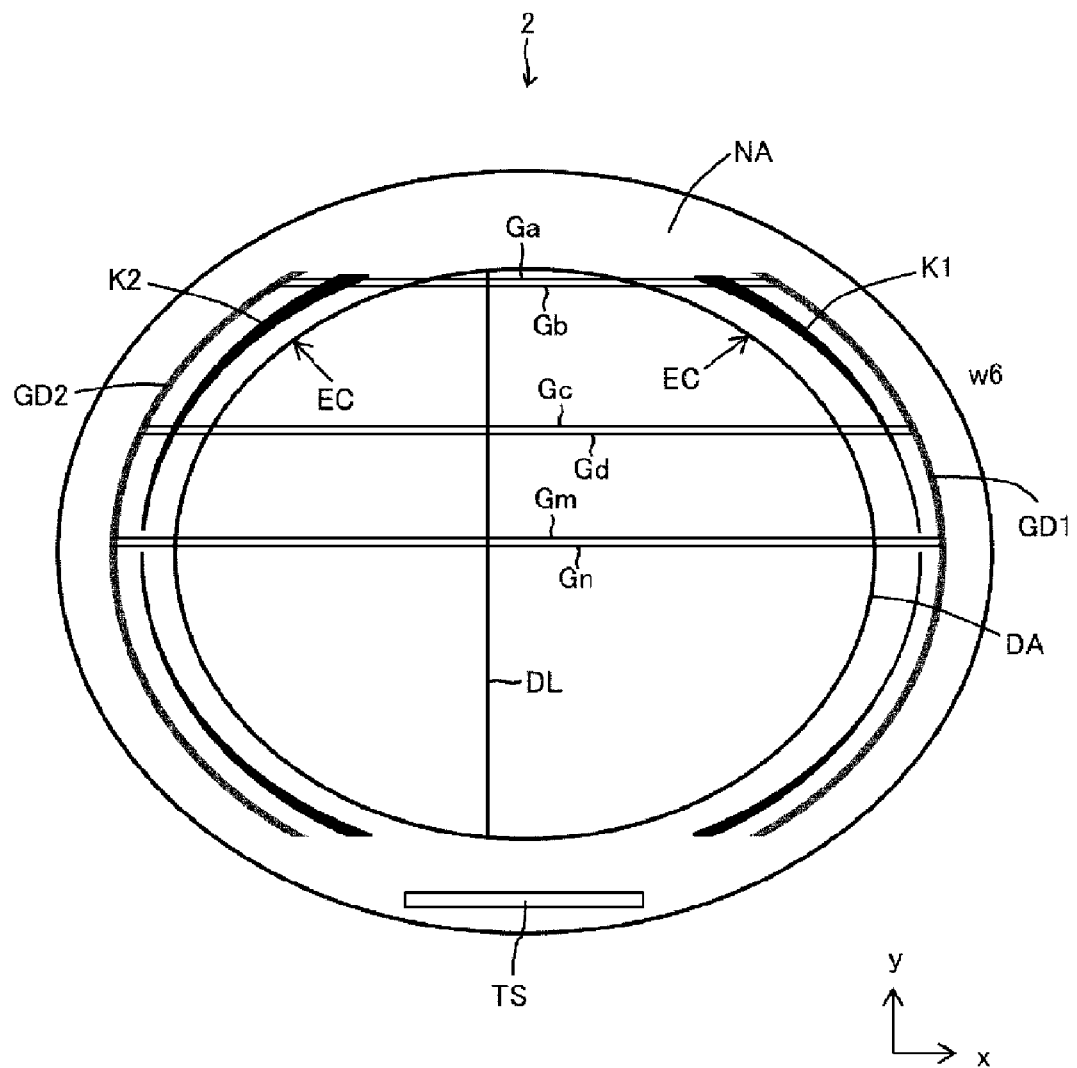
FIG. 11 is a plan view illustrating a configuration of a display device of a second embodiment.
Figure 12:
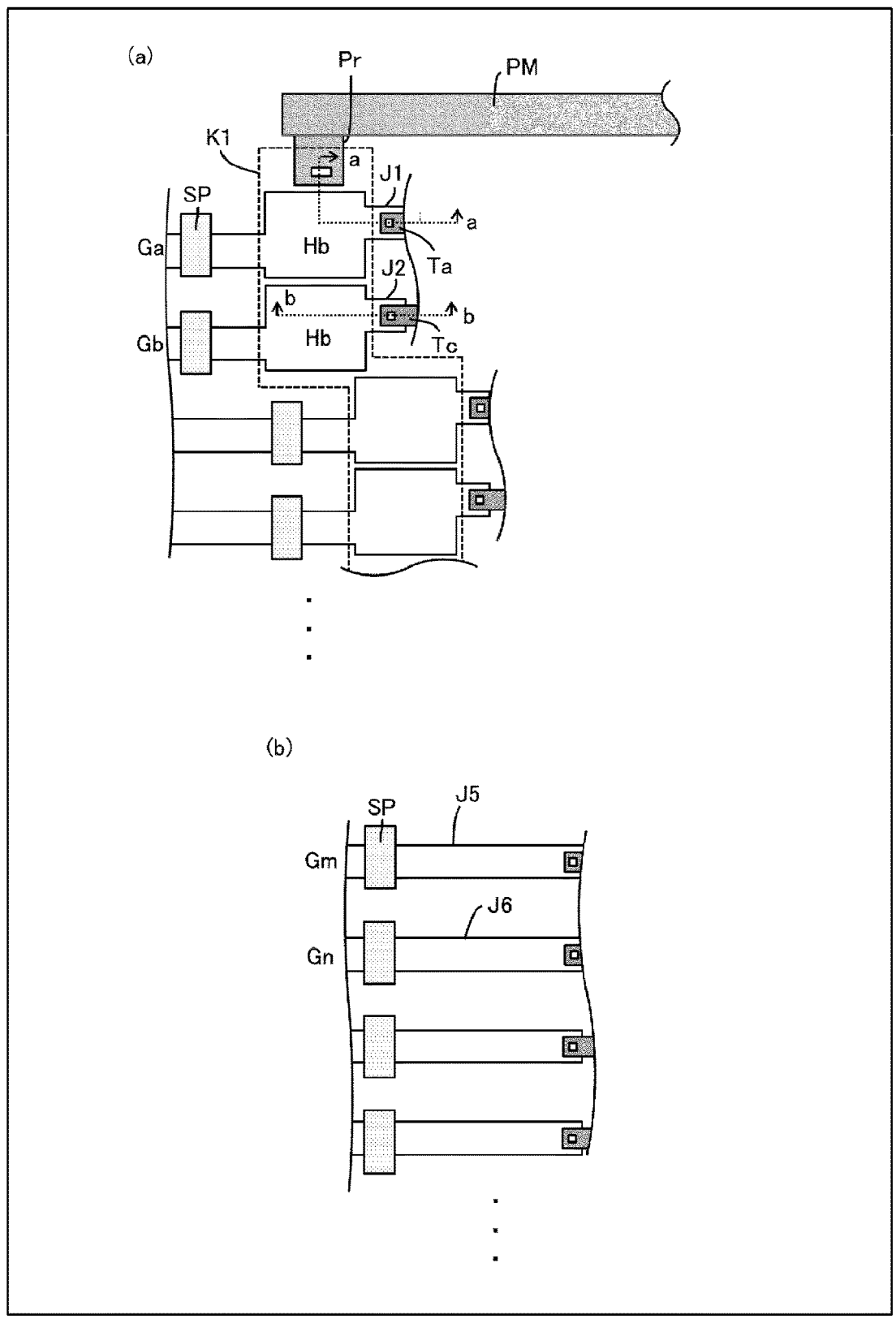
FIG. 12 is a plan view illustrating a configuration of a periphery of an edge of a display region.

FIG. 11 is a plan view illustrating a configuration of a display device of a second embodiment. FIG. 12 is a plan view illustrating a configuration of a periphery of an edge of a display region. FIG. 13(a) is a cross-sectional view taken along a-a of FIG. 12. FIG. 13(b) is a cross-sectional view taken along b-b of FIG. 12.

Figure 13:
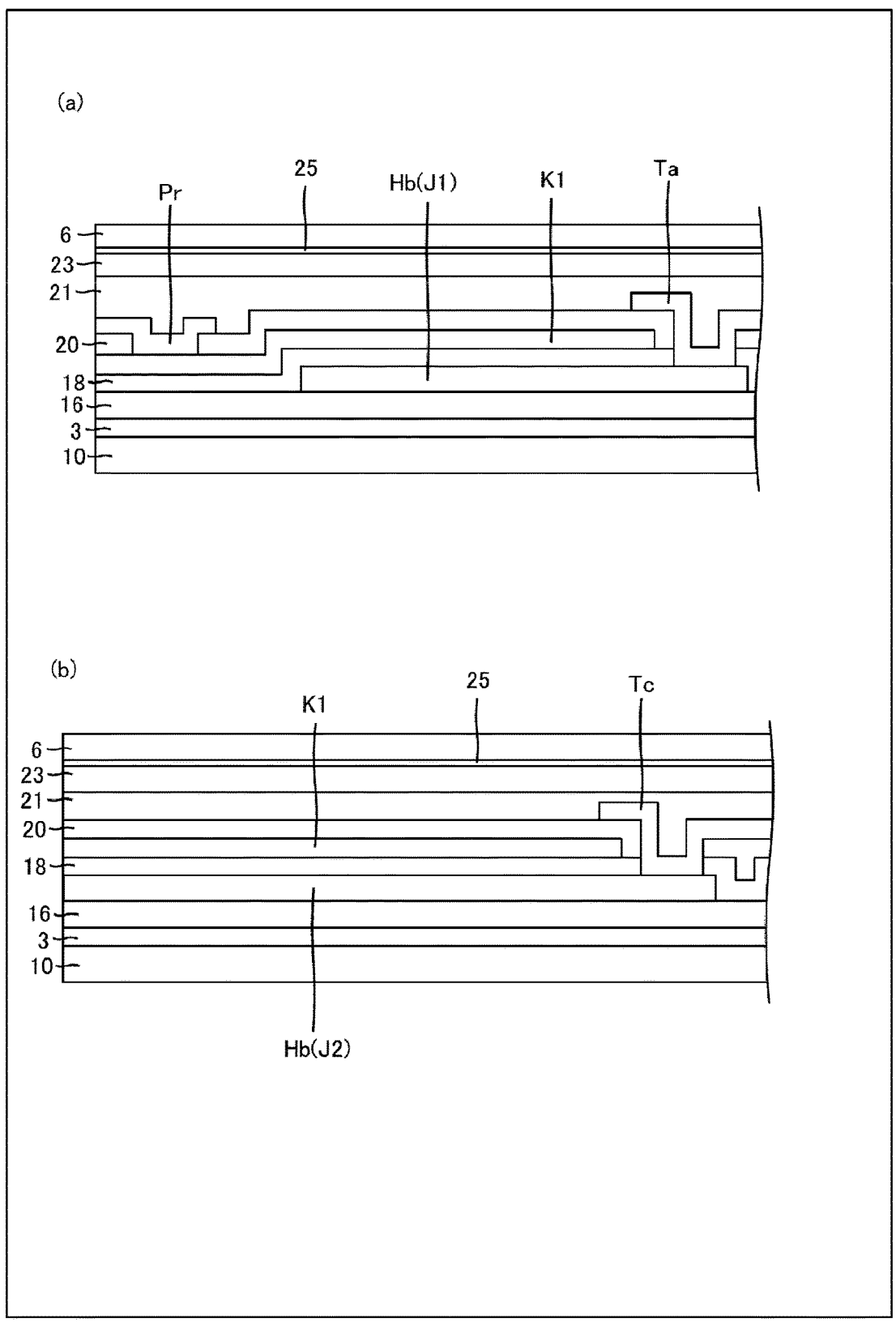
FIG. 13(a) is a cross-sectional view taken along a-a of FIG. 12, and (b) is a cross-sectional view taken along b-b of FIG. 12.

In the second embodiment, as illustrated in FIG. 12 and FIG. 13, a conductive film K1 (provided in a second metal layer) provided in a gap between a curved line edge EC and a gate driver GD1, and extension wiring lines J1 and J2 and the conductive film K1 are superposed on one another through intermediation of an inorganic insulating film 18. Specifically, each of the extension wiring lines J1 and J2 has a wide portion Hb that is locally wide, and the conductive film K1 is superposed entirely on each of the wide portions Hb. Each of the wide portions has a longitudinal shape in which a size in an extension direction (x direction) is larger than a size in a width direction (y direction perpendicular to the x direction). In this manner, capacitance between the wide portions Hb and the conductive film K1 can be applied to the extension wiring lines J1 and J2 from scanning signal lines Ga and Gb, and luminance unevenness in the minor axis (y direction) of a display region DA can be suppressed. Note that, similarly, in the vicinity of a gate driver GD2, a conductive film K2 overlapping extension wiring lines from the scanning signal lines Ga and Gb is provided.

In FIG. 12 and FIG. 13, the conductive film K1 is coupled to, via a contact hole, a low voltage power source line Pr branched from a low voltage power source trunk wiring line PM (provided in a third metal layer), and a low voltage power source (ELVSS) is supplied to the conductive film K1. The low voltage power source (ELVSS) is supplied to a cathode 25 of a light-emitting element ES. In addition, the conductive film K1 overlaps the cathode 25 (common cathode electrode of each of subpixel circuits).

Note that a configuration in which the conductive film K1 is electrically coupled to a high voltage power source trunk wiring line and the high voltage power source (ELVDD) is supplied to the conductive film K1 may be adopted. Note that the high voltage power source (ELVDD) is supplied to the capacitance Cp of the subpixel circuit of FIG. 4.

Note that, as illustrated in FIG. 12(b), extension wiring lines J5 and J6 extending from scanning signal lines Gm and Gn having a substantially maximized drive load do not overlap the conductive film K1 (no capacitance is applied).

THIRD EMBODIMENT

Figure 14:
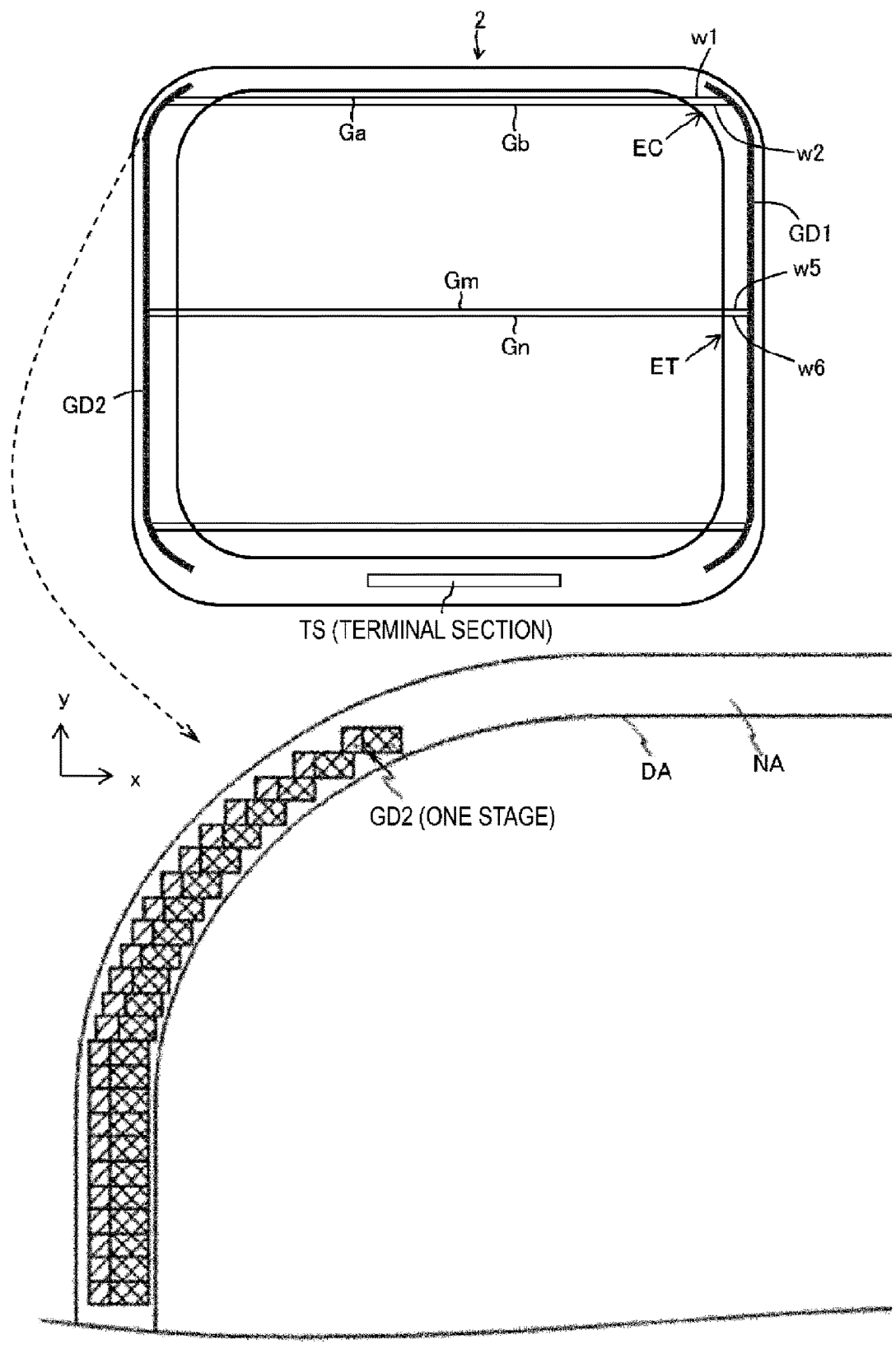
FIG. 14 is a plan view illustrating a configuration of a display device of a third embodiment.

FIG. 14 is a plan view illustrating a configuration of a display device of a third embodiment. In the first and second embodiments, the display region DA has an elliptical shape. However, the shape is not limited to this. As illustrated in FIG. 14, a display region DA may have a curved line edge EC (rounded corner) and a linear edge ET. In this case, lead wiring lines w1 and w2 that are electrically coupled to scanning signal lines Ga and Gb reaching the curved line edge EC may be provided in a frame region NA, and the lead wiring lines w1 and w2 may overlap each other through intermediation of an inorganic insulating film. Note that lead wiring lines w5 and w6 that are electrically coupled to scanning signal lines Gm and Gn (maximized drive load) reaching the linear edge ET do not overlap each other.

Supplement

An electro-optical element (an electro-optical element having luminance and transmittance controlled by a current) provided in a display device according to the present embodiment is not particularly limited. Examples of the display device according to the present embodiment include an organic Electro Luminescence (EL) display provided with an Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

First Aspect

A display device including:
a display region having a non-rectangular shape; and
a frame region surrounding the display region,
wherein the display region includes
a plurality of data signal lines configured to transmit a data signal,
a plurality of control lines intersecting the plurality of data signal lines, and
a plurality of subpixel circuits provided correspondingly to intersections between the plurality of data signal lines and the plurality of control lines,
the frame region includes
a first lead wiring line being electrically coupled to one of the plurality of data signal lines or one of the plurality of control lines,
a second lead wiring line being electrically coupled to a data signal line adjacent to the one of the plurality of data signal lines or a control line adjacent to the one of the plurality of control lines,
a drive circuit being electrically coupled to the first lead wiring line, and
a drive circuit being electrically coupled to the second lead wiring line,
the first lead wiring line is provided in a first metal layer,
the second lead wiring line is provided in a second metal layer being different from the first metal layer, and
the first lead wiring line and the second lead wiring line are superposed on one another through intermediation of an inorganic insulating film.

Second Aspect

The display device, for example according to the first aspect, wherein the first lead wiring line and the second lead wiring line are led except for a superposed portion, and are adjacent to each other in a plane view.

Third Aspect

The display device, for example according to the first aspect or the second aspect, wherein the adjacent data signal line or the adjacent control line extends from an edge of the display region to the frame region, and is electrically coupled to the second lead wiring line via an extension wiring line provided in the first metal layer.

Fourth Aspect

The display device, for example according to any one of the first aspect to the third aspect, wherein the second lead wiring line is electrically coupled to the drive circuit via a relay wiring line provided in the first metal layer.

Fifth Aspect

The display device, for example according to any one of the first aspect to the fourth aspect,
wherein a plurality of drive circuits are formed along the edge of the display region in the frame region,
a signal is transmitted to the one of the plurality of data signal lines or the one of the plurality of control lines from a drive circuit being electrically coupled to the first lead wiring line,
a signal is transmitted to the adjacent data signal line or the adjacent control line from a drive circuit being electrically coupled to the second lead wiring line,
at least one corner portion of the display region having a non-rectangular shape has a curved shape or an inclined shape, and the first lead wiring line and the second lead wiring line are formed between the drive circuit and the corner portion.

Sixth Aspect

The display device, for example according to any one of the first aspect to the fifth aspect, wherein the first lead wiring line and the second lead wiring line are formed between the drive circuit and a portion of the edge of the display region having a non-rectangular shape, the portion having a curved shape or an inclined shape.

Seventh Aspect

The display device, for example according to any one of the first aspect to the sixth aspect,
wherein at least one corner portion of the display region having a non-rectangular shape has a curved shape or an inclined shape, and
the first lead wiring line and the second lead wiring line are disposed in the frame region positioned in an outer side of the corner portion.

Eighth Aspect

The display device, for example according to the first aspect or the second aspect, wherein one of the plurality of data signal lines or one of the plurality of control lines extends from an edge of the display region to the frame region, and is electrically coupled to the first lead wiring line via an extension wiring line provided in the first metal layer.

Ninth Aspect

The display device, for example according to any one of the first aspect to the eighth aspect, wherein the plurality of control lines include at least one of a plurality of scanning signal line and a plurality of light emission control lines.

Tenth Aspect

The display device, for example according to the ninth aspect, wherein the first lead wiring line is electrically coupled to one of two adjacent scanning signal lines, and the second lead wiring line is electrically coupled to the other of the two adjacent scanning signal lines.

Eleventh Aspect

The display device, for example according to the ninth aspect, wherein the first lead wiring line is electrically coupled to one of two adjacent light emission control lines, and the second lead wiring line is electrically coupled to the other of the two adjacent light emission control lines.

Twelfth Aspect

The display device, for example according to the ninth aspect, wherein one of a scanning signal line and a light emission control line that are adjacent to each other and the first lead wiring line are electrically coupled to each other, and the other and the second lead wiring line are electrically coupled to each other.

Thirteenth Aspect

The display device, for example according to any one of the first aspect to the twelfth aspect, wherein the display region has an elliptical shape or a circular shape.

Fourteenth Aspect

The display device, for example according to any one of the first aspect to the thirteenth aspect, wherein a drive circuit being electrically coupled to the plurality of control lines is disposed in the frame region along the display region having a non-rectangular shape.

Fifteenth Aspect

The display device, for example according to any one of the first aspect to the fourteenth aspect, wherein the display region is provided with a gate electrode provided in the first metal layer and a capacitance electrode provided in the second metal layer.

Sixteenth Aspect

The display device, for example according to any one of the first aspect to the fifteenth aspect,
wherein the frame region includes a third lead wiring line and a fourth lead wiring line that are electrically coupled to two adjacent control lines or two adjacent data signal lines,
the third lead wiring line and the fourth lead wiring line overlap each other through intermediation of the inorganic insulating film,
overlapping area of the third lead wiring line and the fourth lead wiring line is smaller than overlapping area of the first lead wiring line and the second lead wiring line, and
a control line being electrically coupled to the third lead wiring line is coupled to more subpixel circuits than a control line being electrically coupled to the first lead wiring line.

Seventeenth Aspect

The display device, for example according to the sixteenth aspect, wherein an overlapping width of the third lead wiring line and the fourth lead wiring line is smaller than an overlapping width of the first lead wiring line and the second lead wiring line.

Eighteenth Aspect

The display device, for example according to the sixteenth aspect, wherein an overlapping length of the third lead wiring line and the fourth lead wiring line is smaller than an overlapping length of the first lead wiring line and the second lead wiring line.

Nineteenth Aspect

The display device, for example according to the sixteenth aspect,
wherein the frame region includes a fifth lead wiring line and a sixth lead wiring line that are electrically coupled to two adjacent control lines or two adjacent data signal lines,
the fifth lead wiring line and the sixth lead wiring line do not overlap each other, and a scanning signal line being electrically coupled to the fifth lead wiring line is coupled to more subpixel circuits than a scanning signal line being electrically coupled to the third lead wiring line.

Twentieth Aspect

The display device, for example according to any one of the first aspect to the nineteenth aspect, wherein the first lead wiring line and the second lead wiring line overlap each other in a portion extending in one direction.

Twenty-First Aspect

The display device, for example according to any one of the first aspect to the twentieth aspect,
wherein the display region has an elliptical shape, and the plurality of control lines extend in a direction parallel with a major axis of the display region.

Twenty-Second Aspect

The display device, for example according to the third aspect or the eighth aspect, wherein the second metal layer includes a conductive film overlapping the extension wiring line through intermediation of the inorganic insulating film.

Twenty-Third Aspect

The display device, for example according to any one of the first aspect to the twenty-second aspect, wherein the first lead wiring line and the second lead wiring line are electrically coupled to two control lines provided in the first metal layer.

Twenty-Fourth Aspect

The display device, for example according to any one of the first aspect to the twenty-third aspect,
wherein each of the first lead wiring line and the second lead wiring line includes a wide portion being locally wide, and
the wide portion of the first lead wiring line and the wide portion of the second lead wiring line are superposed on one another.

The invention claimed is:
1. A display device comprising:
a display region having a non-rectangular shape; and
a frame region surrounding the display region,
wherein the display region includes
a plurality of data signal lines configured to transmit a data signal,
a plurality of control lines intersecting the plurality of data signal lines, and
a plurality of subpixel circuits provided correspondingly to intersections between the plurality of data signal lines and the plurality of control lines,
the frame region includes
a first lead wiring line being electrically coupled to one of the plurality of control lines, and a second lead wiring line being electrically coupled to a control line adjacent to the one of the plurality of control lines,
wherein the frame region further includes
a drive circuit being electrically coupled to the first lead wiring line, and
the drive circuit being electrically coupled to the second lead wiring line,
the first lead wiring line is provided in a first metal layer,
the second lead wiring line is provided in a second metal layer being different from the first metal layer, and
the first lead wiring line and the second lead wiring line are superposed on one another through intermediation of an inorganic insulating film,
wherein the frame region further includes a third lead wiring line and a fourth lead wiring line that are electrically coupled to two adjacent control lines,
the third lead wiring line and the fourth lead wiring line overlap each other through intermediation of the inorganic insulating film,
overlapping area of the third lead wiring line and the fourth lead wiring line is smaller than overlapping area of the first lead wiring line and the second lead wiring line, and
a control line being electrically coupled to the third lead wiring line is coupled to more subpixel circuits than a control line being electrically coupled to the first lead wiring line.
2. The display device according to claim 1,
wherein an overlapping width of the third lead wiring line and the fourth lead wiring line is smaller than an overlapping width of the first lead wiring line and the second lead wiring line.
3. The display device according to claim 1,
wherein an overlapping length of the third lead wiring line and the fourth lead wiring line is smaller than an overlapping length of the first lead wiring line and the second lead wiring line.
4. The display device according to claim 1,
wherein the frame region further includes a fifth lead wiring line and a sixth lead wiring line that are electrically coupled to two adjacent control lines,
the fifth lead wiring line and the sixth lead wiring line do not overlap each other, and
the control line being electrically coupled to the fifth lead wiring line is coupled to more subpixel circuits than the control line being electrically coupled to the third lead wiring line.

* * * * *